PULSE WIDTH SHAPING CIRCUIT

Filed Nov. 28, 1956

INVENTOR.

Richard A. Day,

BY

Edwin A. Olsen

AGENT.

United States Patent Office 2,946,899

Patented July 26, 1960

2,946,899

PULSE WIDTH SHAPING CIRCUIT

Richard A. Day, North Redondo Beach, Calif., assignor to Hughes Aircraft Company, Culver City, Calif., a corporation of Delaware Filed Nov. 28, 1956, Ser. No. 625,574

5 Claims. (Cl. 307—88.5)

The present invention relates to pulse generators, and more particularly to a pulse shaping circuit which produces rectangular voltage pulses.

In many electronic systems it is necessary to utilize electric pulses as timing signals to synchronize various circuits of a system. In such applications as digital computers, the timing signals are generally referred to as clock pulses. To insure that the clock pulses perform the function of accurately synchronizing the circuits of the system, the pulses must have a rectangular configuration with a steep leading edge and a steep trailing edge, and must have a uniform width. In the past, blocking oscillators have often been utilized for producing rectangular pulses or square waves. A discussion of such oscillators may be found in "Waveforms" of the M.I.T. Radiation Laboratories Series, No. 19 pages 205–253; by McGraw-Hill New York, 1949. The primary disadvantage of using blocking oscillators for producing rectangular pulses is the difficulty of controlling the leading edge or rise time of the pulse and the width of the pulse.

It is an object of the present invention to provide a pulse shaping circuit which will produce rectangular pulses of controlled width and having a fast rise time.

It is a further object of the present invention to provide a pulse shaping circuit which will produce rectangular pulses having a width which is independent of the width of the input pulse to the circuit.

In accordance with the present invention, a pulse shaping circuit is provided which utilizes a first semiconductor amplifier such as a junction transistor, including an inductive element which may be in its load circuit for storing electromagnetic energy when the amplifier is in a conducting state. An input signal is applied to the amplifier for alternately rendering the amplifier conducting and nonconducting. A second semiconductor amplifier, which may also be a junction transistor, has an input circuit for controlling the current flow through the second amplifier and is connected to the inductive element by means of a capacitive element. The input circuit, the capacitive element and the inductive element form a series resonant circuit which is responsive to the state of conduction of the first amplifier in that the resonant circuit is energized only when the first amplifier is rendered nonconducting.

Figure 1:
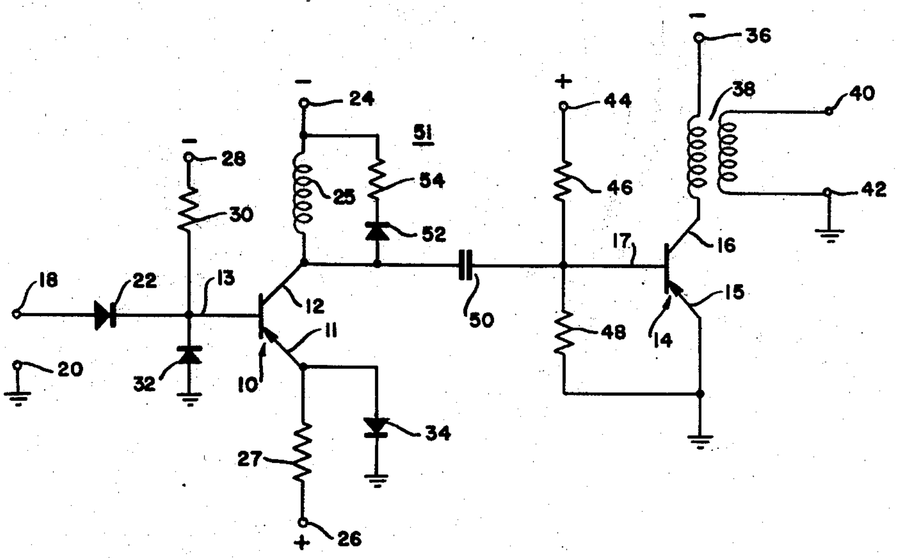
Figure 2:
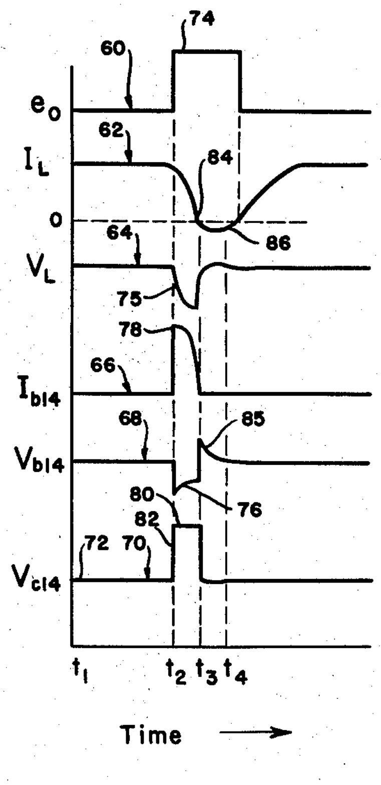

The novel features which are believed to be characteristic of the invention both as to its organization and method of operation, together with further objects and advantages thereof will be better understood from the following description considered in connection with the accompanying drawing in which:

Fig. 1 is a schematic circuit diagram of a pulse shaping circuit embodying the present invention; and Fig. 2 is a graph illustrating wav forms taken at various points throughout the circuit of Fig. 1.

Referring now to the drawing, and more particularly to Fig. 1, there is shown a pulse shaping circuit which includes two transistors 10 and 14. The transistors are illustrated as junction transistors of the PNP type; however, it is to be understood that other types of transistors such as an NPN type transistor or point contact transistor may be utilized as the active elements in the circuit with appropriate changes in the bias conditions to insure their proper operation. The transistor 10 includes an emitter electrode 11, a collector electrode 12 and a base electrode 13, and transistor 14 is provided with an emitter electrode 15, a collector electrode 16 and a base electrode 17.

A pair of input terminals 18 and 20, one of which is connected to ground, are coupled to the input or base-emitter circuit of the transistor 10 by means of a gating element such as a semiconductor diode 22. The anode of the diode 22 is connected to the terminal 18 and its cathode to the base 13 to permit only positive input signals that are impressed between the terminals 18, 20 to be applied to the input or base-emitter circuit of the transistor 10.

For the purpose of providing operating bias for the transistor 10, two suitable sources of direct current energizing potential may be separately connected to two terminals 24 and 26. A negative source may be connected to the terminal 24 and a positive source may be connected to the terminal 26. A temperature stabilizing resistor 27 is connected between the terminal 26 and the emitter 11. An inductor 25 is connected between the terminal 24 and the collector 12. The inductor is included in the load circuit of the transistor 10 to store electromagnetic energy when the transistor 10 is conducting.

The transistor 10 is connected in a grounded emitter configuration with its base-emitter junction biased in the forward direction by an additional negative bias source which may be connected to the terminal 28 through a base resistor 30. This additional negative bias renders the transistor 10 conducting in the absence of a positive input signal.

The effect of differences in the parameters of transistors of the same type or of changes in the parameters of the same transistor due to temperature changes are compensated for by means of the temperature stabilizing resistor 27 and a pair of temperature stabilizing semiconductor diodes 32 and 34. The diode 32 has its cathode connected to the base 13 and its anode connected to ground. The diode 32 is maintained forward biased in the absence of an input signal by the negative voltage source connected to the terminal 28 and the base resistor 30. Because of the voltage drop across the forward biased diode 32, the base 13 is clamped at a small negative voltage with respect to ground. The voltage drop across the forward biased base-emitter junction of the transistor 10 is less than the voltage drop across the forward biased diode 32 and hence the emitter 11 is maintained at some potential between the negative potential of the base 13 and ground when the transistor 10 is conducting. The diode 34 has its anode connected to the emitter 11 and its cathode to ground to prevent the emitter voltage from rising to a value above ground when the transistor 10 is rendered nonconducting.

The transistor 14 is also connected in a grounded emitter configuration with its operating bias being provided by a suitable negative source which may be connected to the terminal 36 through the primary winding of a coupling transformer 38 connected in turn to the collector 16. The emitter electrode 15 is connected to ground to complete the collector-emitter circuit of the transistor 14. The secondary winding of the coupling transformer 38 is connected across a pair of output terminals 40 and 42 to impress the signal developed in the collector-emitter circuit of the transistor 14 across the output terminals. The base-emitter junction of the transistor 14 is biased in the reverse direction by means of a suitable negative source which may be connected to the terminal 44 and a pair of voltage divider resistors 46 and 48. As shown in Fig. 1, the resistor 46 is connected between the terminal 44 and the base 17 and the resistor 48 is connected between the base 17 and ground.

The base-emitter circuit of the transistor 14 is coupled to the inductor 25 by means of a capacitor 50. The inductor 25, the capacitor 50, and the base-emitter circuit of the transistor 14 form a series resonant circuit whereby the state of conduction of the transistor 14 is controlled by the current flow through this resonant circuit. The term current flow as used herein refers to conventional current flow and not to electron current flow. The resonant circuit is responsive to the state of conduction of the transistor 10 in that the resonant circuit is not energized when the transistor 10 is conducting and is energized only when the transistor 10 is rendered nonconducting.

Electromagnetic energy is stored in the inductor 25 when the transistor 10 is conducting and this energy is tranferred to the capacitor 50 as an electrostatic charge when the transistor 10 is rendered nonconducting. This transfer of energy from the inductor 25 to the capacitor 50 impresses a negative voltage between the base and emitter of the transistor 14 and thereby biases the base-emitter junction of the transistor 14 in the forward direction. Hence, the charging current of the capacitor 50 flows through the base-emitter circuit of the transistor 14 during the time that the energy transfer from the inductor to the capacitor takes place. To prevent the resonant circuit 25, 50 from ringing after the initial transfer of energy from the inductor 25 to the capacitor 50, and thereby rendering the transistor 14 conducting after the initial transfer of energy from the inductor 25 to the capacitor 50, a damping impedance network 51 consisting of a unidirectionally conducting element such as a semiconductor diode 52 and a resistor 54 may be connected in parallel with the inductor 25. The diode 52 has its anode connected to the collector 12 and its cathode connected in series with the resistor 54 to the terminal 24. The damping impedance network is not essential to the operation of the circuit and may be eliminated in certain applications. For example, the resonant circuit may be sufficiently damped without the use of the damping impedance so that the transistor 14 is rendered conducting only during the initial transfer of energy from the inductor 25 to the capacitor 50 or alternatively the output pulse of the pulse shaping circuit may be clipped to eliminate the effects of the ringing of the resonant circuit.

In discussing the operation of the circuit of Fig. 1, reference is now made to Fig. 2 wherein the abscissa represents time and the ordinate represents voltage in the curves designated by $e_o$, $V_L$, $V_{b14}$ and $V_{c14}$, and current in the curves designated by $I_L$ and $Ib_{14}$.

At time $t_1$ the input signal impressed between the terminals 18 and 20 is zero as is indicated by the curve $e_o$, also identified in Fig. 2 as 60, which represents the input voltage wave form. The collector-emitter current of the transistor 10 flows through the parallel paths of the inductor 25 and the damping impedance network 51. Because of the low direct-current impedance of the inductor 25 as compared to the impedance of the resistor 54 practically all of the steady-state emitter-collector current of the transistor 10 flows through the inductor 25. This current stores electromagnetic energy in the inductor 25. The steady-state current flow through the transistor 10 is substantially constant and hence the signal voltage impressed between the base and emitter electrodes of the transistor 14 is zero and the transistor 14 is nonconducting. At this time, the voltage impressed across the output terminals 40 and 42 is zero as is indicated by the portion 72 on the curve $V_{c14}$. The curve $V_{c14}$, which is also referred to as 70, is taken by measuring the voltage across the output terminals 40 and 42.

At time $t_2$ a positive signal or pulse 74 as shown by the curve 60 is impressed across the base-emitter circuit of the transistor 10 and biases the base-emitter junction of this transistor in the reverse direction to render the transistor 10 nonconducting. As a result of the change of the state of conduction of the transistor 10, the electromagnetic energy that is stored in the inductor 25 causes current to continue to flow through the inductor and charge the capacitor 50. The charge on the capacitor 50 resulting from the transfer of energy from the inductor 25 to the capacitor 50 drives the collector 12 negative with respect to terminal 24 as is shown by the portion 75 on the curve $V_L$ or 64. The curve 64 is taken by measuring the voltage across the inductor 25. This charge on the capacitor 50 impresses a negative voltage between the plate and cathode of the diode 52 which biases the diode 52 in the reverse direction. The charge impressed across the capacitor 50 by the current flow through the inductor 25 also causes the base of the transistor 14 to go negative with respect to its emitter 15 and thereby biases the base-emitter junction of this transistor in the forward direction as is shown by the portion 76 on the curve $V_{b14}$. The curve $V_{b14}$, also referred to by the reference numeral 68, is taken by measuring the voltage between the base and emitter electrodes 17 and 15 or between the base 17 and ground.

The low impedance of this forward biased base-emitter circuit results in a very large base current as shown by the portion 78 on the curve $I_{b14}$ through the transistor 14. The curve $I_{b14}$ which is also referred to by the numeral 66 is taken by measuring the current flow through the base electrode 17. The high current flow through the base 17 immediately drives the transistor 14 into its current saturation region of operation and produces a voltage pulse as shown by the portion 80 of the curve 70 in the collector circuit of the transistor 14 or across the output terminals 40 and 42. This voltage pulse has a steep leading edge or a fast rise time as shown at 82.

The inductor 25, the capacitor 50 and the base-emitter circuit of the transistor 14 form a series resonant circuit as pointed out before and the resonant frequency of this circuit determines the time that the current flows through the inductor 25 to charge the capacitor 50 and hence the time that current flows through the base-emitter circuit of the transistor 14. Since current flows through the inductor 25 to charge the capacitor 50 during one quarter of one complete cycle of the resonant circuit, the time duration of the output pulse 80 is approximately equal to one quarter of the time required for one complete cycle of operation of the resonant circuit.

At time $t_3$ the first quarter cycle of operation of the resonant circuit is completed and the current flow through the inductor 25 drops to zero, as is indicated by the point 84 on the curve $I_L$. This curve $I_L$ which is also referred to by the reference numeral 62 is taken by measuring the current flow through the inductor 25. At this time, the capacitor 50 immediately discharges through the inductor 25. The charge across the capacitor 50 impresses a positive voltage 85 as shown by the curve 68 between the base and emitter electrodes of the transistor 14 and thereby biases the base-emitter junction of this transistor in the reverse direction to render the transistor 14 nonconducting again. The base emitter junction which is now biased presents a high impedance path to the discharge current of the capacitor 50. The resistor 48 which has a resistance of the order of several hundred ohms presents a low impedance path to the discharge current of the capacitor 50 as compared to the back biased base-emitter junction of the transistor 14. Hence the discharge current of the capacitor 50 flows through the resistor 48. The resistance of the resistor 48 is low compared to the impedance of the back biased base-emitter circuit of the transistor 14 but is high compared to the impedance of the base-emitter circuit of the transistor 14 when biased in the forward direction. Because of the resistance of the resistor 48, most of the energy, that is stored in the capacitor 50 during the first quarter cycle of operation of the resonant circuit is dissipated in the resistor 48 during the time that the capacitor 50 is discharging or during the second quarter cycle of operation. However, some of the energy associated with the capacitor 50 will be transferred to the magnetic field of the inductor 25 during the second quarter cycle of operation of the resonant circuit.

At time $t_4$ the second quarter cycle of operation is completed and the capacitor 50 is completely discharged. The electromagnetic energy stored in the inductor 25 at this time again causes current to continue to flow through the inductor as is shown by the portion 86 on the curve 62. This current flow in the inductor 25 is opposite to the direction of current flow through the inductor during the first quarter cycle of operation of the resonant circuit or opposite to the direction of the current flow through the inductor 25 when the transistor 10 is conducting. The diode 52 is poled to pass this current and hence the current that flows through the inductor 25 now flows through the damping impedance network 51. The resistance of the resistor 54 is low, i.e., of the order of 50 ohms, and hence the energy that is stored in the inductor 25 during the second quarter cycle of operation of the resonant circuit is now dissipated in the resistor 54. This prevents the capacitor 50 from charging again and biasing the base-emitter junction of the transistor 14 once more in the forward direction.

The specific values of the inductor 25 and the capacitor 50 may be chosen to determine the resonant frequency of the resonant circuit and hence the time that current flows through the base-emitter junction of the transistor 14 to produce an output pulse 80 across the terminals 40 and 42. As is shown by the curve 60, the input pulse 74 of the pulse shaping circuit of Fig. 1 must be wider or have a greater time duration than the output pulse 80 that is developed across the terminals 40 and 42; however, the input pulse 74 need only have a time duration greater than the time that is required for the first quarter cycle of operation of the resonant circuit.

While it is understood that the circuit specifications of the pulse shaping circuit of the present invention may vary according to the design for any particular application, the following circuit specifications for the circuit of Fig. 1 to give a 5 volt amplitude output pulse with .1 microsecond rise time, .8 microsecond duration and .15 microsecond fall time, are included by way of example only.

| | |
|---|---|
| Transistors 10 and 14 | [1] type ZJ11 |
| Source of potential connected to terminal 28 volts | −30 |
| Source of potential connected to terminal 24 volts | −2 |
| Source of potential connected to terminal 26 volts | +5 |
| Source of potential connected to terminal 44 volts | +5 |
| Source of potential connected to terminal 36 volts | −10 |
| Resistor 30 ohms | 14,000 |
| Resistor 27 do | 250 |
| Inductor 25 microhenrys | 200 |
| Capacitor 50 micromicrofarads | 800 |
| Resistor 46 ohms | 10,000 |
| Resistor 48 do | 500 |

[1] Manufactured by the General Electric Company.

There has thus been provided a pulse shaping circuit which utilizes a first transistor including an inductive element which may be in its load circuit for storing electromagnetic energy when the transistor is conducting. An input signal or pulse is applied to this transistor for alternately rendering the transistor conducting and nonconducting. A second transistor having an input circuit for controlling the current flow through the second transistor is connected to the inductive element by means of a capacitive element. The inductive element, the capacitive element and the input circuit of the second transistor form a series resonant circuit whcih is responsive to the state of conduction of the first transistor and controls the current flow through the second transistor in accordance with the current flow through the resonant circuit. An output circuit is coupled to the second transistor for deriving an output signal therefrom.

The pulse shaping circuit of the present invention produces rectangular pulses having a fast rise time and having a width or time duration which is independent of the width or time duration of the input pulse to the circuit where the input pulse has a time duration equal to or greater than the time duration of the output pulse of the circuit.

What is claimed:

1. A pulse shaping circuit for developing output pulses comprising a first transistor including a first emitter, a first collector and a first base in contact therewith, input signal means coupled between said first base and said first emitter for applying an input signal thereto, bias means coupled between said first base and said first emitter for rendering said first transistor conducting in the absence of said input signal, an inductive element connected in series with said first collector and said first emitter for storing electromagnetic energy in response to said first transistor being conducting, a second transistor including a second emitter, a second collector and a second base in contact therewith, capacitive means connected between said inductive element and said second base and resonant with said inductive element with a period of oscillation corresponding to a resonant frequency thereof, said inductive element, said capacitive element and the base-emitter circuit of said second transistor forming a series resonant circuit, bias means coupled to the base-emitter circuit of said second transistor for rendering said second transistor nonconducting in the absence of current flow through said resonant circuit after a time of conduction equal to one quarter of said period, and means coupled to the collector and emitter electrodes of said second transistor for deriving the output pulse therefrom having a width equal to the time of one quarter of said period.

2. A pulse shaping circuit for developing an output pulse comprising a first transistor including a first emitter, a first collector and a first base in contact therewith, signal input means coupled between said first base and said first emitter for applying an input signal thereto, bias means including a voltage source coupled between said first base and said first emitter for rendering said first transistor conducting in the absence of said input signal, an inductor connected in series with said first collector for storing electromagnetic energy in response to current flow through said first collector, a second transistor including a second emitter, a second collector and a second base in contact therewith, a capacitor connected between said second base and said inductor resonant with said inductor at a resonant frequency having a corresponding period of oscillation, said inductor, said capacitor and said second base and said second emitter forming a series resonant circuit, whereby said second base and said second emitter are traversed by current flowing through said resonant circuit, bias means coupled between said second base and said second emitter for rendering said second transistor nonconducting in the absence of current flowing through said resonant circuit after a time of conduction of said second transistor equal to one quarter of said period, and means coupled between said second collector and said second emitter for deriving the output pulse therefrom having a pulse width equal to the time of one quarter of said period.

3. A pulse shaping circuit for developing an output pulse of a predetermined width comprising a first transistor including a first emitter, a first collector and a first base in contact therewith, input signal means coupled to said first base and said first emitter for applying an input signal thereto, bias means coupled to said first base and said first emitter for rendering said first transistor conducting in the absence of said input signal, an inductor connected in series with said first collector for storing electromagnetic energy when said first transistor is conducting, a second transistor including a second emitter, a second collector and a second base in contact therewith, a capacitor connected between said first collector and said second base for providing a series resonant circuit having a resonant frequency including said inductor, said capacitor and the base-emitter circuit of said second transistor for developing a current signal with a predetermined period of oscillation corresponding to said resonant frequency, bias means coupled to the base-emitter circuit of said second transistor for rendering said second transistor nonconducting in the absence of current flow through said resonant circuit after a time of conduction of said second transistor equal to one quarter of said period, a damping impedance network connected across said inductor for damping the oscillations of said resonant circuit thereby to prevent said resonant circuit from ringing, and means coupled to the collector and emitter electrodes of said second transistor for deriving the output pulse therefrom having a pulse width equal in time to one quarter of said period.

4. A pulse shaping circuit for developing an output pulse having a predetermined width comprising a first transistor including a first emitter, a first base and a first collector in contact therewith, bias means coupled between said first base and said first emitter for rendering said first transistor nonconducting in the absence of a signal being applied between said first base and said first emitter, an inductor connected in series with said first collector and said first emitter for storing electromagnetic energy in response to conduction of said first transistor, a second transistor including a second emitter, a second base and a second collector, capacitive means connected between said inductor and said second transistor for providing a series resonant circuit at a resonant frequency having a predetermined period of oscillation including said inductor, said capacitive means and said second base and said second emitter, signal input means coupled between said first base and said first emitter to render said first transistor selectively nonconducting, whereby said electromagnetic energy is transferred into an electrostatic charge on said capacitive means, said transformation of energy being effective to render said second transistor conducting for a time equal to one quarter of said period, and means coupled to said second transistor for deriving the output pulse therefrom having a width equal in time to one quarter of said predetermined period.

5. A circuit for developing output pulses having a preselected width comprising a first transistor including a first emitter, a first base and a first collector in contact therewith, bias means coupled between said first base and said first emitter for rendering said first transistor nonconducting in the absence of a signal being applied between said first base and said first emitter, an inductor connected in series with said first collector for storing electromagnetic energy in response to conduction of said first transistor, a second transistor including a second emitter, a second base and a second collector in contact therewith, a capacitor connected between said first collector and said second base for providing a series resonant circuit having a resonant frequency and including said inductor, said capacitor, and said second base and said second emitter said resonant circuit when energized having a preselected period of oscillation as determined by said resonant frequency, bias means connected between said second base and said second emitter for rendering said second transistor nonconducting in the absence of said resonant circuit being energized, signal input means including a gating element connected between said first base and said first emitter to render said first transistor selectively nonconducting whereby said electromagnetic energy is transferred into an electrostatic charge on said capacitor to energize said resonant circuit, said transformation of energy being effective to render said second transistor conducting for a time equal to one quarter of said period, a damping impedance network coupled to said inductor for damping the oscillations of said resonant circuit, and means coupled to said second collector for deriving the output pulse therefrom having a width equal in time to one quarter of said period.

References Cited in the file of this patent

UNITED STATES PATENTS

| | | |
|---|---|---|
| 2,414,968 | Moe | Jan. 28, 1947 |
| 2,440,547 | Jensen | Apr. 27, 1948 |
| 2,499,234 | Tourshou | Feb. 28, 1950 |
| 2,644,897 | Lo | July 7, 1953 |
| 2,758,206 | Hamilton | Aug. 7, 1956 |
| 2,812,390 | Van Overbeek | Nov. 5, 1957 |
| 2,843,681 | Van Overbeek | July 15, 1958 |
| 2,878,382 | Creveling | Mar. 17, 1958 |
| 2,910,596 | Carlson | Oct. 27, 1959 |

FOREIGN PATENTS

| | | |
|---|---|---|
| 1,084,478 | France | July 7, 1954 |
| 615,856 | Great Britain | Jan. 12, 1949 |